United States Patent
Antretter et al.

(10) Patent No.: US 10,924,686 B2
(45) Date of Patent: Feb. 16, 2021

(54) OPTOELECTRONIC LIGHTING DEVICE, METHOD OF ILLUMINATING A SCENE, CAMERA AND MOBILE TERMINAL

(71) Applicant: OSRAM Opto Semiconductors GmbH, Regensburg (DE)

(72) Inventors: Marco Antretter, Parkstetten (DE); Mikko Perälä, Tegernheim (DE); Ludwig Plötz, Arnschwang (DE); Désirée Queren, Neutraubling (DE); Ulrich Streppel, Regensburg (DE)

(73) Assignee: OSRAM OLED GmbH, Regensburg (DE)

( * ) Notice: Subject to any disclaimer, the term of this patent is extended or adjusted under 35 U.S.C. 154(b) by 0 days.

(21) Appl. No.: 16/083,103

(22) PCT Filed: Feb. 24, 2017

(86) PCT No.: PCT/EP2017/054316
§ 371 (c)(1),
(2) Date: Sep. 7, 2018

(87) PCT Pub. No.: WO2017/153185
PCT Pub. Date: Sep. 14, 2017

(65) Prior Publication Data
US 2019/0104246 A1    Apr. 4, 2019

(30) Foreign Application Priority Data
Mar. 10, 2016    (DE) .................... 10 2016 104 381.8

(51) Int. Cl.
*H04N 5/235*    (2006.01)
*G03B 15/05*    (2006.01)
(Continued)

(52) U.S. Cl.
CPC ............ *H04N 5/2354* (2013.01); *G03B 7/16* (2013.01); *G03B 15/05* (2013.01); *H01L 25/167* (2013.01); *H04N 5/2256* (2013.01)

(58) Field of Classification Search
CPC .. H04N 5/2354; H04N 5/2256; H01L 25/167; G03B 15/05; G03B 7/16
See application file for complete search history.

(56) References Cited

U.S. PATENT DOCUMENTS 6,993,255 B2    1/2006   Braun et al.
7,920,205 B2 *  4/2011   Awazu .................. G03B 15/02
                                                              348/371
(Continued)

FOREIGN PATENT DOCUMENTS

CN    101309536 A    11/2008
CN    102325397 A    1/2012
(Continued)

OTHER PUBLICATIONS

First Office Action dated Feb. 3, 2020, from corresponding Chinese Application No. 201780016302.X, with English translation.
(Continued)

*Primary Examiner* — Timothy J Henn
(74) *Attorney, Agent, or Firm* — DLA Piper LLP (US)

(57) ABSTRACT

An optoelectronic lighting device that illuminates a scene to be captured as an image includes a pixelated emitter including a plurality of light emitting pixels that illuminate a scene to be captured as an image, and a driving device configured to individually drive the pixels depending on at least one parameter to illuminate the scene to be recorded with a predetermined illuminance distribution.

22 Claims, 8 Drawing Sheets

(51) Int. Cl.
*H04N 5/225* (2006.01)
*G03B 7/16* (2014.01)
*H01L 25/16* (2006.01)

(56) References Cited

U.S. PATENT DOCUMENTS

| | | | |
|---|---|---|---|
| 8,218,963 B2 | 7/2012 | Adelsberger et al. | |
| 8,395,311 B2 | 3/2013 | Morimoto | |
| 8,427,274 B2 | 4/2013 | Jones et al. | |
| 8,577,218 B2 | 11/2013 | von Malm et al. | |
| 8,761,594 B1* | 6/2014 | Gross | H04N 5/2256 396/155 |
| 9,192,021 B2 | 11/2015 | Häfner et al. | |
| 9,362,335 B2 | 6/2016 | von Malm | |
| 2002/0191102 A1* | 12/2002 | Yuyama | H04N 5/2256 348/370 |
| 2005/0046739 A1* | 3/2005 | Voss | H04N 5/2354 348/371 |
| 2005/0134723 A1* | 6/2005 | Lee | G03B 15/02 348/370 |
| 2005/0168965 A1* | 8/2005 | Yoshida | G03B 15/05 362/3 |
| 2012/0154627 A1 | 6/2012 | Rivard et al. | |
| 2012/0189291 A1* | 7/2012 | von Malm | G03B 15/05 396/157 |
| 2013/0064531 A1* | 3/2013 | Pillman | H04N 5/23296 396/62 |
| 2013/0194795 A1* | 8/2013 | Onaka | F21V 5/04 362/231 |
| 2014/0340572 A1 | 11/2014 | Sato et al. | |
| 2015/0014716 A1* | 1/2015 | von Malm | H01L 27/15 257/89 |
| 2016/0040854 A1* | 2/2016 | Zhang | H01L 25/0753 362/242 |
| 2016/0088278 A1* | 3/2016 | Velarde | H04N 9/735 348/371 |
| 2016/0156853 A1* | 6/2016 | Fukushima | H04N 5/23245 348/333.12 |
| 2016/0344910 A1* | 11/2016 | Shen | H04N 5/2256 |
| 2016/0352993 A1* | 12/2016 | Gerasimow | H04N 5/2354 |
| 2017/0094138 A1* | 3/2017 | Mirhosseini-Schubert | H04N 5/2256 |
| 2018/0324343 A1* | 11/2018 | Van Der Sijde | G06K 9/00288 |

FOREIGN PATENT DOCUMENTS

| | | |
|---|---|---|
| CN | 105242484 A | 1/2016 |
| DE | 10 2005 021 808 A1 | 11/2006 |
| DE | 10 2007 050 167 A1 | 4/2009 |
| DE | 10 2008 062 640 A1 | 7/2009 |
| DE | 10 2012 004 817 A1 | 9/2013 |
| DE | 10 2013 221 221 A1 | 4/2015 |
| DE | 10 2014 101 896 A1 | 8/2015 |
| DE | 10 2016 124 866 A1 | 6/2018 |
| DE | 10 2016 124 871 A1 | 6/2018 |
| EP | 1 689 148 A1 | 8/2006 |

OTHER PUBLICATIONS

The Second Office Action dated Aug. 25, 2020, of counterpart Chinese Application No. 201780016302.X, with English translation.

* cited by examiner

OPTOELECTRONIC LIGHTING DEVICE, METHOD OF ILLUMINATING A SCENE, CAMERA AND MOBILE TERMINAL

TECHNICAL FIELD

This disclosure concerns an optoelectronic lighting device, a method of illuminating a scene to be captured as an image, a camera and a mobile terminal.

BACKGROUND

It is known to illuminate a scene to be captured as an image with a flash light. Typical flash lights usually illuminate a scene with a fixed intensity distribution and color distribution.

A pixelated emitter, for example, is known from DE 102014101896 A1, the subject matter of which is incorporated herein by reference.

There is nonetheless a need to provide an efficient means to efficiently illuminate a scene to be captured as an image.

SUMMARY

We provide an optoelectronic lighting device that illuminates a scene to be captured as an image including a pixelated emitter including a plurality of light emitting pixels that illuminate a scene to be captured as an image, and a driving device configured to individually drive the pixels depending on at least one parameter to illuminate the scene to be recorded with a predetermined illuminance distribution.

We also provide a method of illuminating a scene to be captured as an image with the optoelectronic lighting device that illuminates a scene to be captured as an image including a pixelated emitter including a plurality of light emitting pixels that illuminate a scene to be captured as an image, and a driving device configured to individually drive the pixels depending on at least one parameter to illuminate the scene to be recorded with a predetermined illuminance distribution including providing at least one parameter, and illuminating the scene to be recorded with a predetermined illuminance distribution by driving the light emitting pixels by the driving device based on the at least one parameter.

We further provide a camera that captures an image of a scene including an image sensor that captures an image of a scene, an object lens that images the scene onto the image sensor, and the optoelectronic lighting device that illuminates a scene to be captured as an image including a pixelated emitter including a plurality of light emitting pixels that illuminate a scene to be captured as an image, and a driving device configured to individually drive the pixels depending on at least one parameter to illuminate the scene to be recorded with a predetermined illuminance distribution.

We also further provide a mobile terminal including the camera that captures an image of a scene including an image sensor that captures an image of a scene, an object lens that images the scene onto the image sensor, and the optoelectronic lighting device that illuminates a scene to be captured as an image including a pixelated emitter including a plurality of light emitting pixels that illuminate a scene to be captured as an image, and a driving device configured to individually drive the pixels depending on at least one parameter to illuminate the scene to be recorded with a predetermined illuminance distribution.

Figure 1:
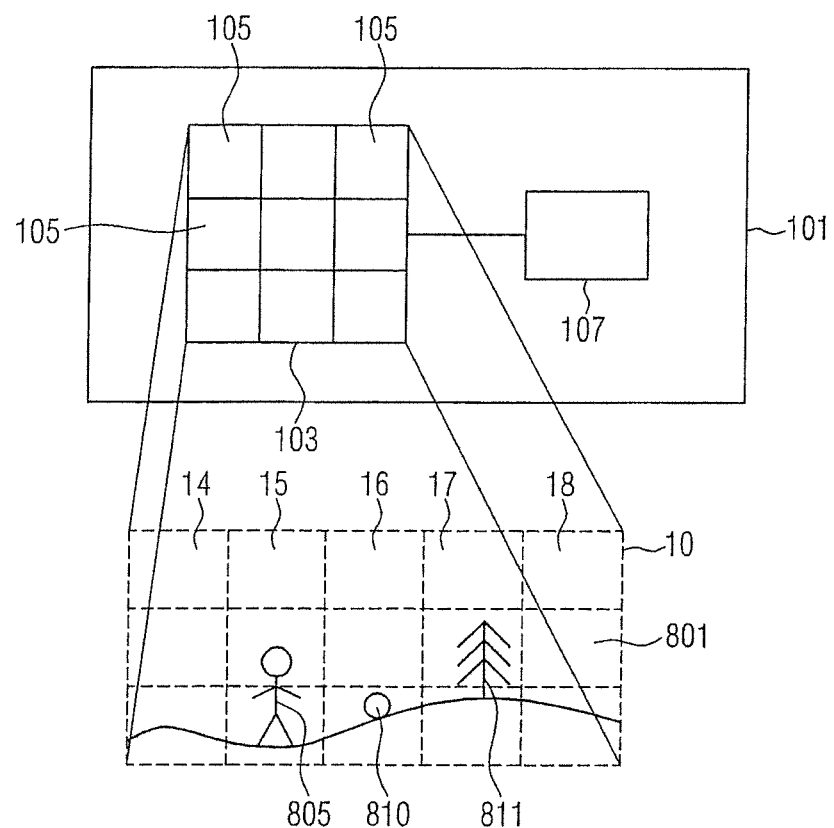
FIG. 1 shows an optoelectronic lighting device.

REFERENCE SIGN LIST 10 field of view
14 section
15 section
16 section
17 section
18 section
20 switch
25 intermediate carrier
26 via
27 lead
41 pixels
42 pixels
43 pixels
61 semiconductor chip
62 semiconductor chip
8 optical element
81 segment
82 segment
90 semiconductor layer sequence
91 converter
92 converter
93 diffuser
101 optoelectronic lighting device
103 pixelated emitter
105 light emitting pixel
107 driving device
190 active zone
191 first semiconductor layer
192 second semiconductor layer
195 recess
197 carrier
201 providing
203 driving
205 illumination
301 camera
303 image sensor
305 object lens
401 mobile terminal
501 pixelated emitter
503 light emitting pixel
505 switched-on pixel
507 switched-off pixel
601 pixelated emitter
603 light emitting pixel 605 switched off pixel
607 switched on pixel
609 switched on pixel
611 switched on pixel
701 15:9 Recording format
703 4:3 Recording format
711 contact
712 mating contact
721 contact
722 mating contact
731 contact
732 mating contact
801 scene
802 room
803 windows
805 people
807 table
809 candle
810 ball
811 tree
901 pixelated emitter
903 light emitting pixel
905 switched off pixel
907 switched on pixel
909 switched on pixel
1001 scene
1003 dividing line
1005 foreground
1007 background
1009 people
1011 tree
1013 people
1015 tree
1101 pixelated emitter
1103 light emitting pixel
1105 switched off pixel
1107 switched on pixel
1109 switched on pixel
1111 switched on pixel

DETAILED DESCRIPTION

Our optoelectronic lighting device illuminates a scene to be captured as an image and comprises:

a pixelated emitter comprising a plurality of light emitting pixels that illuminate a scene to be captured as an image, and a driving device configured to individually control the pixels depending on at least one parameter to illuminate the scene to be recorded with a predetermined illuminance distribution.

The light device can comprise one or more pixelated emitters. Each pixelated emitter can be assigned its own driving device, or all pixelated emitters are operated with a single driving device.

The at least one pixelated emitter may be the light source of the lighting device that generates the light to illuminate the scene to be captured as an image during operation of the lighting device. The light of the at least one pixelated emitter is emitted, for example, by at least one optical element into a field of view of the lighting device. The field of view can be divided into a plurality of sections. Each section is then illuminated by at least one pixel of the lighting device. In this way, it is possible not only to illuminate the scene to be captured as an image with uniform illuminance distribution, but also to illuminate different sections of the scene with adjustable illuminance levels.

In particular, it is possible that two or more pixels of the lighting device are intended to illuminate a common part of the field of view. In this way it is possible to illuminate each part of the field of view with light of a different kind by using pixels that emit different types of light. The type of light can also refer, for example, to the color temperature and/or the color location of the light used to illuminate the section.

The pixels of the lighting device can be operated separately from each other. This means that each pixel can be operated individually with predefinable current intensities, whereby different pixels can be operated with different current intensities.

Preferably, an imaging lens is designed such that when all pixels are equally supplied with current, an illuminance distribution is created on the target surface which shows a defined drop in illuminance from the center to the corners. For example, the illuminance drops from the value in the center or from the maximum illuminance value to 30% of this value.

The illuminance describes the luminous flux per unit area incident on an illuminated object in the scene to be captured as an image. Thereby the illuminance can vary from section to section of the field of view, resulting in a certain distribution of the illuminance over the entire field of view. The illuminance is a photometric quantity in which the individual wavelengths of the illuminating radiation are weighted by the sensitivity of the eye at the relevant wavelength. In this way, the illuminance is also influenced by the color of the illuminating light. For example, if a section of the field of view is radiated with red light, the red light emitting pixel producing light of a certain irradiance, the illuminance in another section, which is irradiated with green light, is higher there due to the increased sensitivity of the eye in the green spectral region, if the corresponding green pixel emits light of the same irradiance.

We also provide a method of illuminating a scene to be captured as an image using the optoelectronic lighting device, comprising the following steps:

providing at least one parameter, and illuminating the scene to be recorded with a predetermined illuminance distribution by driving the light emitting pixels by the driving device based on the at least one parameter.

A camera is provided to capture an image of a scene, comprising:

an image sensor that captures an image of a scene, a object lens that images the scene on the image sensor, and the optoelectronic lighting device that illuminates a scene to be captured as an image.

A mobile terminal may be provided, the mobile terminal comprising the optoelectronic lighting device that illuminates a scene to be captured as an image or the camera that captures an image of a scene.

We found that the above tasks can be addressed by using a pixelated emitter having several light emitting pixels that can be individually controlled. The light emitting pixels are individually controllable light emitting pixels. The light emitting pixels can be controlled individually with the driving device such that, for example, different pixels emit light of different intensity. This has the particular technical advantage that a predetermined illuminance distribution can be set for the scene to be recorded. This means that the individual control of the light emitting pixels no longer prescribes a fixed illuminance distribution, but rather enables a variable, i.e., adjustable, illuminance distribution.

By providing a parameter based on which the driving device controls the pixels individually, the technical advantage in particular is that an appropriate illuminance distribution can be set by selecting a suitable parameter.

This has the particular technical advantage of providing an efficient way to efficiently illuminate a scene to be captured as an image.

For the pixelated emitter it is possible that each pixel of the pixelated emitter is configured with a single semiconductor chip, for example, a light emitting diode chip. However, it is preferred that the pixelated emitter has at least one semiconductor chip comprising two or more of the plurality of pixels. This means that the pixelated emitter comprises one or more semiconductor chips divided into several pixels. Such a semiconductor chip can be a pixelated light emitting diode chip in particular.

This has the advantage that the distance of the pixels of the pixelated emitter is predetermined by the structuring of the semiconductor chip into several pixels and can be adjusted in this way, for example, by lithographic methods. In contrast, in a pixelated emitter in which each pixel is configured by a single semiconductor chip, the semiconductor chips must be placed side by side with high accuracy such that they are all aligned to a downstream optical system. For a pixelated emitter comprising one or more semiconductor chips, each semiconductor chip comprising two or more of the plurality of pixels, this alignment effort is reduced.

In extreme cases it is possible that the pixelated emitter contains exactly one semiconductor chip that contains all pixels. In this case, the pixelated emitter consists exactly of a semiconductor chip. This minimizes the alignment effort since only a single semiconductor chip needs to be aligned to the downstream optical system.

The optoelectronic lighting device may comprise two or more pixelated emitters and an optical element, the optical element being designed such that each pixel of one of the pixelated emitters is assigned a pixel of another of the pixelated emitters such that the radiation emitted by these pixels overlap in a common section of the scene to be recorded. In particular, it is possible that each of the pixelated emitters is formed by exactly one semiconductor chip, i.e., consists of exactly one semiconductor chip.

For example, there may be a pixelated emitter whose pixels emit warm white light in operation, a pixelated emitter whose pixels emit cold white light in operation, and one or more pixelated emitters which emit colored light in operation. The optical element allows the different light to be projected onto the same sections of the field of view. In this way it is possible to illuminate each section in the field of view with light of a predefinable illuminance by operating the corresponding pixels. This means that the intensity, the color location and the color with which each section in the field of view is illuminated can be selected particularly easily in this way.

For example, the optical element can be a lens with two or more segments, with a pixelated emitter uniquely assigned to each segment. This means that the light of each pixelated emitter then only passes through the assigned segment of the optical element.

A light emitting pixel includes in particular a pn junction. When an electrical voltage is applied to such a pn junction, the pn junction emits light.

Consequently, this means that a light emitting pixel has several semiconductor layers comprising an n-doped and a p-doped semiconductor layer. In the simplest case, an n- and a p-doped semiconductor layer are provided.

A scene refers in particular to an arrangement of one or more objects in three-dimensional space. For example, an object is a person. For example, an object is an animal. For example, an object is a thing. An object, for example, is a non-living three-dimensional body. For example, an object is a plant. For example, an object is a tree.

At least some of the pixels may be designed to emit light of different wavelengths, wherein the driving device individually drives the pixels depending on the at least one parameter such that the scene to be recorded is illuminated with a predetermined spectral intensity distribution.

This has the particular technical advantage that the scene to be recorded can be illuminated with a predetermined spectral intensity distribution. Thus, for example, the further technical advantage is that a color temperature can be adjusted efficiently. In particular, this has the technical advantage that an efficient white balance can be carried out.

The fact that the pixels emit light of different wavelengths means, for example, that the pixels comprise different converter layers or converter materials. For example, the pixels emitting different wavelengths have different semiconductor layers. For example, the semiconductor layers differ in their layer thickness and/or in their semiconductor material.

For example, the different pixels are arranged in a chessboard structure. This means in particular that directly next to a pixel there is only one further pixel that emits light with a different wavelength than the one pixel. This means that in a chessboard structure directly adjacent pixels are formed differently and thus emit correspondingly different wavelengths.

The pixels, for example, emit light with different shades of white. This allows a particularly efficient lighting of the scene to be carried out in an advantageous manner.

The driving device may control the pixels individually, depending on the at least one parameter such that predetermined locations in the scene to be recorded are each illuminated with light having a predetermined color temperature.

This has the particular technical advantage that a predetermined color location can be set efficiently at the predetermined locations. This makes it possible, for example, to reduce or even avoid color temperature mixtures in an advantageous way. In particular, it is advantageous to achieve a more uniform and homogeneous color rendering in the scene to be recorded.

The driving device may control a respective operating current for the pixels depending on the at least one parameter.

This has the particular technical advantage that the pixels can be controlled efficiently. To control an operating current, for example, the driving device applies different voltages to the pixels.

The at least one parameter may be an element selected from the following group of parameters, respectively: a recording format of the image, a location of a luminous light source in the scene, a color temperature of a luminous light source in the scene, a light intensity of a luminous light source in the scene, a distance of an object in the scene from the pixelated emitter, a material property of an object in the scene.

The term material property of an object is to be understood in a broad sense. For example, the material property of an object can be the nature of a surface or part of the surface of the object. For example, this is a dominant color on the surface of the object. A dominant color of the surface of the object is the predominant color impression created when looking at the surface of the object. For example, a ripe tomato has the dominant color "red" or a ripe banana has "yellow" dominant color.

Furthermore, the nature of the surface of the object may be the reflectivity of the surface of the object. The reflectivity of the surface determines in particular which part of the light with which the object is illuminated is directly or diffusely reflected. For example, it is possible to illuminate an object whose surface has a high reflectivity with a lower illuminance than an object whose surface has a lower reflectivity. In this way, power can be saved on the one hand when operating the lighting device. This is possible because sections of the field of view that reflect a lot of light anyway are less illuminated and therefore the corresponding pixel(s) that illuminate the section(s) in which the object is located have to be operated with a lower current. In this way, it is also possible to prevent parts of the recorded image from being overexposed without having to remove them by post-processing the image, which also consumes energy.

The material property can also be the type of object. For example, an object can be recognized as a person's face, so the material property is the fact that the object is a person's face.

A light source is, for example, an active light source, i.e., a self-luminous light source. Such a light source can also be called a 1st order light source.

A light source is, for example, a passive light source. A passive light source emits light only by illumination or in particular by illumination from another light source. This, for example, by reflection and/or, for example, by induced emission.

For example, a passive light source can be described as a 2nd or higher order light source.

A passive light source is, for example, the moon, which is illuminated by the sun and reflects sunlight.

A passive light source, for example, is a mirror.

For the purposes of this description, a window through which light from another light source shines is also referred to as a light source. The window is classified as a passive light source.

The term "luminous light source" thus includes both self-luminous light sources (active light sources) and non-self-luminous light sources (passive light sources). This means that the formulation "luminous" is only intended to express that the light source is currently emitting light. The term "luminous" is not intended to suggest that light sources are merely self-illuminating light sources.

Whether a light source is luminescent or non-luminescent is irrelevant for the lighting of the scene. It depends on whether the light source emits light at the moment or not. For example, a flashlight is an active light source. However, as long as the flashlight is switched off and the scene is not illuminated, the lighting does not need to be adjusted to a flashlight that is not switched on.

A luminous light source is therefore a light source (active or passive) that emits light at the moment.

By providing the above-mentioned parameters, the technical advantage in particular is that the lighting can be efficiently configured to the specific scene or to the specific recording conditions or general conditions.

An image recording format refers in particular to an aspect ratio of the image. For example, an aspect ratio is 4:3 or 15:9.

The driving device may be designed, depending on the recording format of the image, to drive the light emitting pixels such that light emitting pixels that illuminate an area of the scene which lies outside a recording area corresponding to the recording format are dimmed or switched off compared to light emitting pixels that illuminate the recording area.

This has the particular technical advantage that the illumination of the scene can be efficiently configured to the recording format used. Areas that are not recorded do not usually require lighting either. Dimming or switching off the corresponding pixels, for example, also has the technical advantage that electrical power that has to be used for lighting can be saved. Thus, for example, a capacity of an accumulator that provides the voltage for the light emitting pixels is prevented from damage.

The driving device may be configured depending on a first distance of a first object and a second distance of a second object in the scene from the pixelated emitter, wherein the first distance is smaller than the second distance, to drive the light emitting pixels such that light emitting pixels illuminating the first object are dimmed or switched off compared to light emitting pixels illuminating the second object.

This has the particular technical advantage that more uniform lighting can be achieved. In particular, it can be avoided that objects located at the second distance from the pixelated emitter appear too dark compared to the object located at the first distance from the pixelated emitter.

With a fixed illuminance distribution, in such a case the first object would be illuminated much more strongly than the second object.

This has the particular technical advantage of preventing a foreground from being illuminated much more than a background of the scene. This has the particular technical advantage that a more even illumination of both the foreground and the background can be achieved.

The driving device may be designed and configured to drive the light emitting pixels depending on a reflectivity of the illuminated surface of at least one object such that light emitting pixels illuminating a surface of higher reflectivity compared to light emitting pixels illuminating a surface of lower reflectivity are dimmed or switched off. It is possible that a single object is illuminated whose surface has areas of higher and areas of lower reflectivity. In addition, it is possible that the scene includes several objects with surfaces of different reflectivity. This aspect of the lighting device is based, among other things, on the insight that highly reflective surfaces need to be illuminated less strongly to be clearly perceptible in a recorded image than less strongly reflective surfaces.

The fact that the pixels associated with the surface with higher reflectivity can be operated with a lower current than pixels associated with a surface with lower reflectivity makes the luminaire particularly energy-saving. The assignment of the pixels is preferably done by dividing the field of view of the lighting device into several sections, whereby certain pixels are assigned to each section. If an object of high reflectivity is located in a section, the pixels illuminating this section can be operated with a lower current than pixels illuminating a section in which a surface of lower reflectivity is located.

With such a lighting device it is especially possible to avoid undesired reflections on surfaces with high reflectivity. The surfaces of high reflectivity can be parts of mirrors, water, glass, metal or the like. To determine the reflective surfaces, for example, an intermediate image can be taken, which can be taken with or without pre-flash. A pre-flash is an even illumination of the scene with light of reduced intensity. By analyzing the intermediate image, for example, in a processing device that can also be part of the driving device, the sections with reflective surfaces can then be determined before the final image is captured.

Such a lighting device can also be used particularly advantageously to take paintings or photographs, for example, as pictures hanging on a wall. Especially when taking such pictures, problems may occur due to unnatural colors, reflections, shadow casts and other light sources that illuminate the object. By locally adjusting the brightness and color location of each pixel, a lighting device with a pixelated emitter can remedy these problems.

People who wear glasses can also be photographed in an improved way, for example, by illuminating the areas of high reflectivity, i.e., the lenses, less strongly or not.

The driving device may be configured to drive the light emitting pixels depending on a color of the surface of at least one object such that light emitting pixels illuminating a surface of a first color are dimmed or switched off compared to light emitting pixels illuminating a surface of another color.

For example, objects whose surfaces have different dominant colors can be illuminated or an illuminated object has different areas of its surface which have different dominant colors. With such a lighting device it is possible, for example, to illuminate surfaces or surface areas that have a certain dominant color with a color similar to that color.

If, for example, a scene in which a tomato is present is to be recorded as an image, red pixels can be operated in the part of the field of view that covers the tomato, while in adjacent parts, for example, only warm white and/or cold white pixels are operated. In this way, colored objects can be highlighted. The areas that are particularly illuminated in color can either be selected by the user by selecting these areas on a screen, for example, or the areas can in turn be determined automatically by a processing device. It is also possible that not only the color of a surface is determined by the color of the lighting, but also other material properties are used. For example, the faces of people can be illuminated with particularly warm light and/or with light that has an increased red light component.

The driving device may be designed to control the light emitting pixels such that the face of a person is illuminated with a different illuminance and/or with light of a different color location than the surroundings. In this case, for example, it is possible to illuminate a person's eyes with light of reduced illuminance to avoid a so-called red-eye effect or dazzle of the person. In addition, the faces of people can be illuminated with light that gives the people a particularly healthy impression. This light can be particularly warm white and/or light with a reddish component, for example.

It is also possible to concentrate the lighting on certain areas of the scene to be captured as an image. The pixels that illuminate these areas can then be operated with a particularly high current intensity. In this way, certain areas can be illuminated particularly brightly without consuming more power for the lighting. For example, sections of the field of view in which distant objects are located can be omitted by lighting since in these sections there is little or no light reflected anyway, which serves to brighten up the scene.

For example, it may be necessary to determine the distance from the optoelectronic lighting device to objects in the scene to be captured as an image, i.e., in the field of view of the lighting device. For this purpose, the lighting device may include a device that measures the distance. The driving device can then operate the pixels of the light device depending on the information determined by the device.

The device could be a time-of-flight camera, for example. For this purpose, the scene to be illuminated can be illuminated with infrared light and the distance between the lighting device and the objects in the scene is determined by a time measurement. This is done by measuring the time it takes from the emission of an infrared signal to the reception of a reflected infrared signal. Simpler systems such as autofocus devices can also be used to estimate the distance to objects in the scene to be illuminated.

The illumination, concentrated on certain sections of the field of view of the lighting device, can also be used to highlight certain objects in the captured image. Furthermore, well-lit areas of the scene, where the scene is already brightly illuminated by other light sources or sunlight, can be excluded from illumination by the lighting device. Furthermore, shaded areas, for example, can be illuminated to a particularly high degree if desired.

Concentrated illumination by the lighting device, where the illumination is limited to certain sections, is also useful when taking pictures in particularly dark environments, for example, at night. In this case, too, only objects are illuminated which are arranged close enough to the lighting device to reflect a certain part of the emitted light. For this purpose, the scene can be recorded with a pre-flash. A processing device can then identify sections from which light is reflected such that only pixels that illuminate these sections are selectively operated.

Overall, it is possible to operate our lighting device in a particularly energy-efficient manner since only those pixels are operated that illuminate parts of a field of view from which light is reflected back. Such a lighting device is therefore also particularly suitable for continuous illumination during the recording of a moving scene, for example, the recording of a video. Especially when recording moving scenes, the lighting device must be operated for longer periods of time, which leads to high power consumption with a lighting device that illuminates the scene homogeneously. In this case, continuous analysis of the recorded images, for example, by the processing device can ensure that only pixels are operated that illuminate sections from which light is reflected back.

Furthermore, pixels that illuminate sections of well-lit objects or objects with high reflectivity can be operated with lower current intensities. This also serves for a particularly energy-saving lighting of the scene.

A processing device may be provided and determines the at least one parameter from a captured image of the scene. For example, the processing device is comprised by the camera. For example, the processing device is comprised by the optoelectronic lighting device.

This has the particular technical advantage that at least one parameter can be determined efficiently. In particular, the lighting can be adjusted efficiently to suit specific conditions.

For example, it is possible to determine a location of a luminous light source in the scene, a color temperature of a luminous light source in the scene and/or a light intensity of a luminous light source in the scene and/or a distance of an object in the scene to the pixelated emitter in the captured image using image evaluation methods known per se.

This means that a first image is first taken from the scene without additional illumination by the pixelated emitter, the image taken being analyzed by the processing device to determine the at least one parameter. After the at least one parameter has been determined, it is then provided in particular that the driving device controls the light emitting pixels individually based on the determined parameter such that the scene to be recorded is illuminated with a predetermined illuminance distribution or a predetermined spectral intensity distribution such that the corresponding illuminated or lighted scene can then be or is again detected by the image sensor to take a further image of the scene.

The mobile terminal may be designed as a mobile phone.

The optoelectronic lighting device may be designed as a flash.

The term "or" includes in particular the term "and/or."

Technical functionalities of the process to illuminate a scene to be captured as an image result analogously from corresponding functionalities of the optoelectronic lighting device that illuminates a scene to be captured as an image and vice versa. This means in particular that process features result from corresponding device features in the optoelectronic lighting device and vice versa.

The term "at least one parameter" includes in particular the case that several parameters are determined or used.

The characteristics, features and benefits described above and the manner in which they are achieved become clearer and more comprehensible in connection with the following description of examples, which are explained in more detail in connection with the drawings.

FIG. 1 shows an optoelectronic lighting device 101 that illuminates a scene to be captured as one image.

Lighting device 101 comprises a pixelated emitter 103 and the pixelated emitter 103 has several light emitting pixels 105 that illuminate a scene to be captured as one image. The light emitting pixels 105 can be individually controlled.

The optoelectronic lighting device 101 further comprises driving device 107 configured to individually drive the pixels depending on at least one parameter to illuminate the scene to be recorded with a predetermined illuminance distribution.

For example, the control unit 107 controls the individual light emitting pixels 105 such that they emit light of different intensities depending on the at least one parameter. Thus, for example, a predetermined illuminance distribution can be set by which the scene to be recorded is illuminated.

For example, pixels 105 are at least partly designed to emit light of different wavelengths. Depending on the actual control of the light emitting pixels 105 by the driving device 107, a predetermined spectral intensity distribution can thus be set in an advantageous manner. Accordingly, the scene to be recorded can be illuminated with a predetermined spectral intensity distribution.

The optoelectronic lighting device, in particular the light emitting pixels 105, illuminate a scene 801 that is to be taken as a static image, for example. Scene 801 is located in field of view 10 of the lighting device that ideally overlaps or coincides with a field of view of a camera taking the image. The field of view 10 can be divided into several sections 14, 15, . . . . Each section 14, 15, . . . is illuminated by one or more pixels 105. By controlling the corresponding pixels 105 assigned to a specific section, the illuminance in this section can be adjusted. In total, therefore, the scene 801 to be recorded can be illuminated with a predetermined illuminance distribution.

The scene can contain several objects, for example, a person 805, a ball 810 and a tree 811. Sections of the field of view 10 can be illuminated with an illuminance level which depends on parameters such as a material property of the objects or a distance of the objects from the lighting device.

Figure 2:
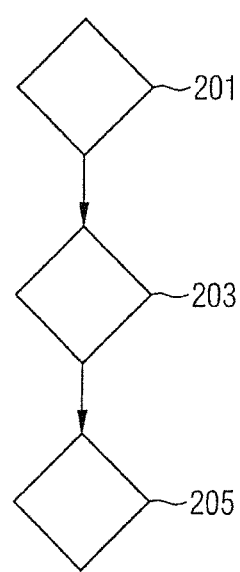
FIG. 2 shows a method of illuminating a scene to be captured as an image.

FIG. 2 shows a flowchart of a method of illuminating a scene to be captured as an image using an optoelectronic lighting device to illuminate a scene to be captured as an image. The lighting device is, for example, the lighting device 101 in FIG. 1.

According to step 201, at least one parameter is to be provided. For example, several parameters are provided.

It is provided according to step 203 that the driving device drives the light emitting pixels depending on the at least one parameter to illuminate the scene to be recorded with a predetermined illuminance distribution according to step 205.

Another image of the scene (not shown) is taken, whereby the scene is illuminated with the predetermined illuminance distribution for taking the further image.

Figure 3:
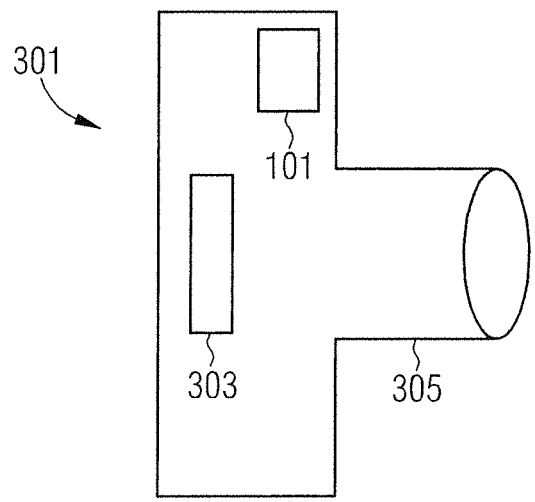
FIG. 3 shows a camera.

FIG. 3 shows a camera 301 that captures an image of a scene.

Camera 301 includes an image sensor 303 that captures an image of a scene. Camera 301 also includes a 305 object lens that images the scene on the 303 image sensor.

The camera 301 also includes the optoelectronic lighting device 101 of FIG. 1, with, for sake of clarity, only a square with the reference sign 101 drawn without the other elements 103, 105, 107.

The camera 301 may comprise a processing device that determines the at least one parameter from a captured image of the scene.

For example, the processing device determines the location of a luminous light source in the scene from a captured image. The location is a parameter based on which the driving device 107 drives the pixels 105. For example, light emitting pixels 105, which would illuminate the illuminating light source, are switched off or dimmed since an area around the light source is already sufficiently illuminated by the light source itself. Areas that do not have a luminous light source, on the other hand, usually need to be illuminated such that, for example, the 105 light emitting pixels that would illuminate such areas need to be switched on to illuminate these areas.

Figure 4:
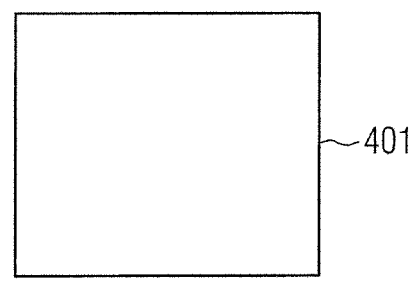
FIG. 4 shows a mobile terminal.

FIG. 4 shows a mobile terminal 401.

The mobile terminal 401, for example, is a mobile phone.

The mobile terminal 401 comprises an optoelectronic lighting device that illuminates a scene to be captured as an image. After a further example, the mobile terminal includes a camera to record an image of a scene.

Figure 5:
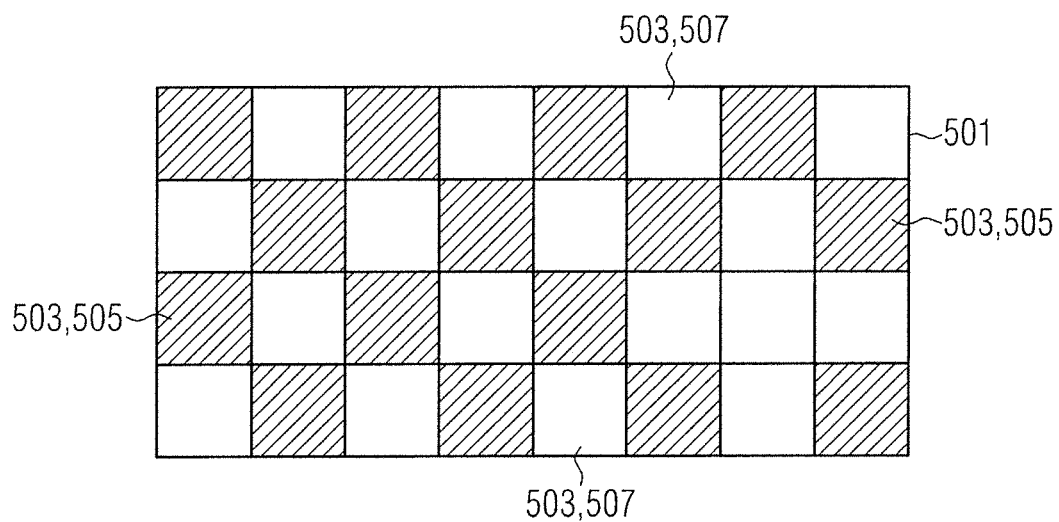
FIG. 5 shows a pixelated emitter.

FIG. 5 shows a pixelated emitter 501 that can be used for an example of the optoelectronic lighting device.

The pixelated emitter 501 contains several pixels 503 and the light emitting pixels 503 can be controlled individually. This, for example, by a driving device.

This means in particular that by subdividing the pixelated emitter 501 into several individually controllable light emitting pixels 503, illumination of a scene to be captured can be changed. For example, a change in a light intensity of light emitted by a respective light emitting pixel 503 can be changed by varying the current level at which the corresponding pixel is operated. By changing or varying the current level, for example, the corresponding pixel is completely switched off, i.e., turned off.

This means that individual pixels 503 can be selectively switched on or off. Switched on pixels can emit light of varying intensity, especially by varying the current level.

For example, the reference sign 505 refers to light emitting pixels 503 that are switched on, i.e., emit light. For example, the reference sign 507 points to light emitting pixels 503 that are switched off, i.e., do not emit any light.

Figure 6:
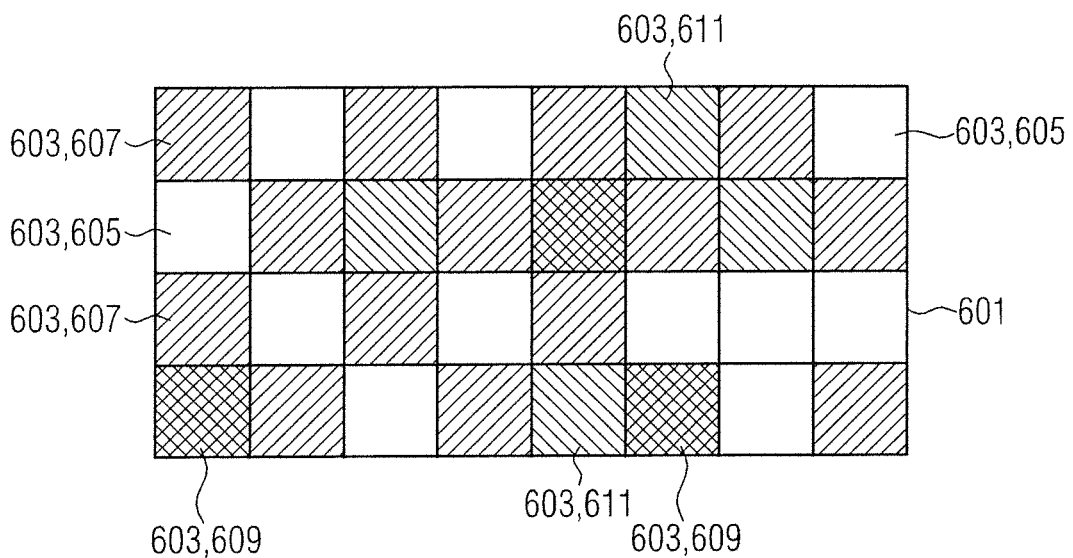
FIG. 6 shows another pixelated emitter.

FIG. 6 shows another 601 pixelated emitter that can be used for optoelectronic lighting.

The pixelated emitter 601 comprises several light emitting pixels 603, and the pixels 603 can be individually controlled in the same way as the pixelated emitter 501. In addition, the 603 light emitting pixels emit light of different wavelengths. This means in particular that the light emitted by the 603 pixels has different spectral distributions.

This can be achieved, for example, by using different converter materials. This can be achieved, for example, by using differently formed semiconductor layers.

For example, the 601 pixelated emitter is designed as a semiconductor chip with a structure or pattern of light emitting pixels. During production of the semiconductor chip, the light emitting pixels can be formed with different materials such that they differ in their spectral distribution.

For example, the reference sign 605 points to light emitting pixels 603 that are switched off, and the reference sign 607 points to switched on pixel that emits light of a first spectral distribution. For example, the reference sign 609 points to switched on pixels that emit light from a second spectral distribution. As an example, the reference sign 611 points to light emitting pixels 603 that emit light from a third spectral distribution.

The three spectral distributions differ from each other.

This makes it advantageously possible to adapt the distribution of illumination of a scene both locally in terms of light intensity and color. This is achieved by a combined control of different light emitting pixels 603.

Figure 7:
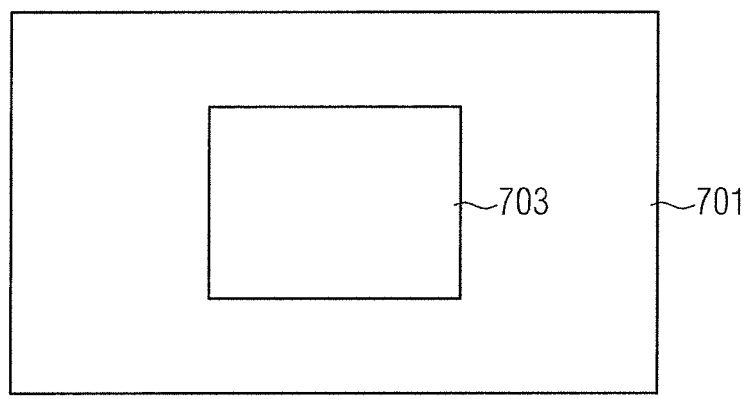
FIG. 7 shows two recording formats.

FIG. 7 shows two recording formats 701, 703.

The 701 recording format corresponds to a 15:9 aspect ratio. The 703 recording format corresponds to a 4:3 aspect ratio.

The recording format, for example, is a parameter based on which the individual light emitting pixels of a pixelated emitter are controlled. For example, in a 4:3 recording format, i.e., recording format 703, it is not necessary for all light emitting pixels to illuminate the scene. Because pixels located at the edge of the pixelated emitter usually do not contribute to the illumination of a recording area corresponding to the recording format 703. Accordingly, the light emitting pixels in the edge area of the pixelated emitter must be activated in a 15:9 recording format, i.e., the recording format 701 to illuminate the correspondingly enlarged recording area.

For example, camera software allows a selection of different recording formats for the scene to be recorded. To achieve a good reproduction of the scene, it is especially intended to adjust the illumination of the scene size accordingly. The illumination is adjusted by a pixelated emitter by selecting certain pixels according to the format. This means that the light emitting pixels are activated or deactivated based on the recording format.

In these cases, the field of view of the lighting device does not match the field of view of the camera. In particular, the field of view of the camera may be smaller than the field of view of the lighting device. Areas in the field of view of the lighting device that are not in the field of view of the camera are then assigned to pixels that are not being operated. In this way, a particularly energy-saving use of the lighting device is possible.

Such a situation in which the field of view of the camera does not match the field of view of the lighting device may also occur in a zoom or macro mode of the camera, for example. In this case, too, the field of view of the camera is reduced and pixels assigned to areas outside the field of view of the camera are not activated. In this way, power can be saved, and it is also possible to operate pixels that illuminate sections of the field of view of the camera with particularly high current and thus with particularly high brightness.

Figure 8:
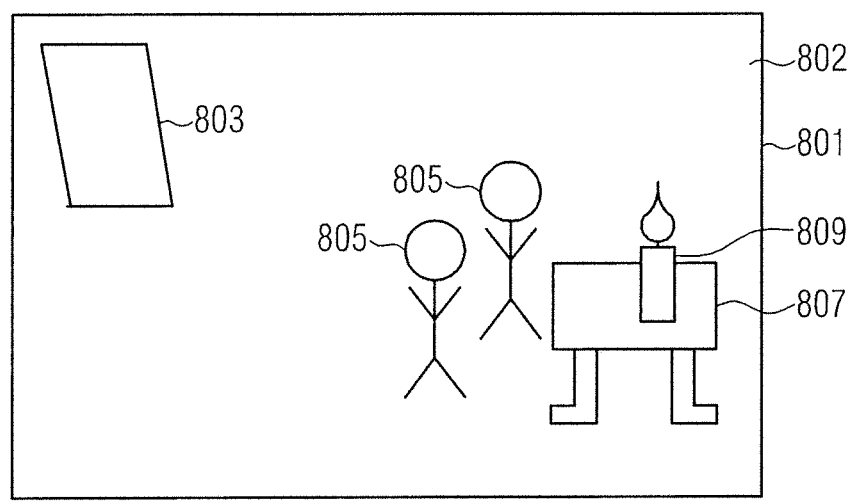
FIG. 8 shows a scene.

FIG. 8 shows a scene 801.

Scene 801 comprises a room 802 in which there is a window 803 in the upper left-hand corner in relation to the paper level. Light shines through window 803, this light is not shown here for the sake of clarity.

Thus, the 803 window forms a luminous light source.

In room 802 there are two persons 805 and to the right of the two persons 805 a table 807, on which a burning candle 809 is arranged.

The burning candle 809 forms another light source located in scene 801.

As a rule, an 809 candle illuminates its surroundings less strongly than an 803 window through which light passes.

For homogeneous illumination, an area around the candle 809 must be illuminated more than an area around the window 803.

For example, if sunlight shines through the 803 window of a midday sun, this sunlight has a higher blue component than the candle light of the burning candle 809, and to achieve a homogeneous spectral distribution or avoid mixing of these different spectral components, scene 801 is illuminated with a predetermined spectral distribution and a predetermined illuminance distribution.

For this purpose, the individual light emitting pixels of a pixelated emitter are controlled accordingly such that pixels that illuminate an area around window 803 are switched off and thus do not contribute to the illumination. Pixels that would directly illuminate an area around the 809 candle are also switched off, for example.

Figure 9:
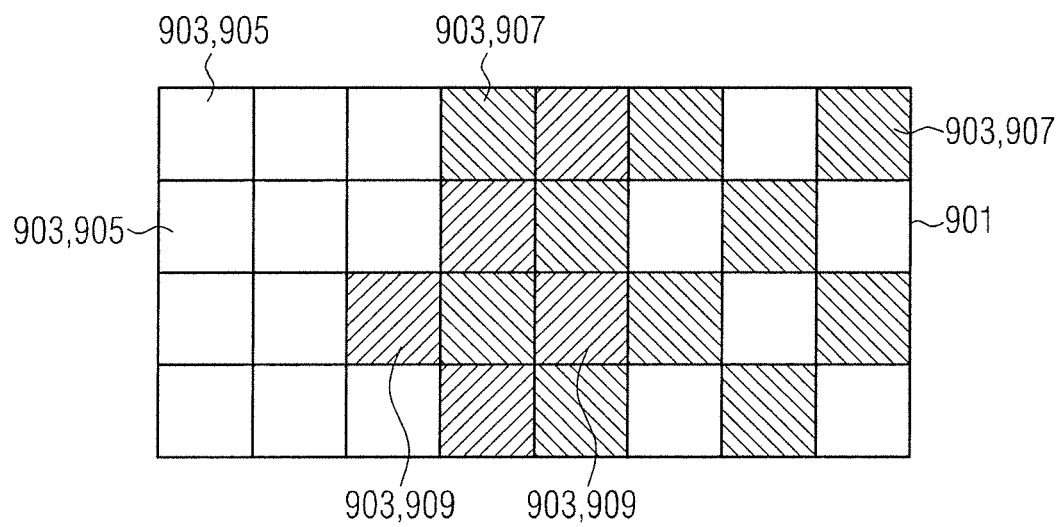
FIG. 9 shows a pixelated emitter to illuminate the scene of FIG. 8.

This is exemplified in FIG. 9 that shows a pixelated emitter 901 comprising several light emitting pixels 903. The reference sign 905 points to switched off pixels 903 that do not contribute to the illumination of scene 801.

The reference sign 907 points to light emitting pixels 903 that are switched on or turned on, and the reference sign 909 also points to pixels 903 that are switched on, with the light emitting pixels 907 dimmed compared to the light emitting pixels 909. This means that the light emitting pixels 907 emit light with a lower intensity than the light emitting pixels 909.

The light emitting pixels 909 are selected to optimally illuminate the two persons 805.

This means, for example, that different light sources can be present at different locations in a scene: for example, the light source 803 and the light source 809 in room 802 of scene 801.

This can lead to inhomogeneous reproduction (recorded image) of the scene, especially after image processing, without additional appropriately configured illumination.

The different light sources 803, 809 in scene 801 usually lead to a different spectrally distributed intensity that can result, for example, in an unnatural and locally different color rendering when applying an algorithm to calculate a white balance to the entire scene.

Using a pixelated emitter with pixels of different spectral distribution, such an effect can be addressed and effectively compensated by illuminating the scene with different spectra. For example, it is intended that an imaging optics is provided in the beam path downstream of the pixels, which can image the light of the light emitting pixels onto the scene.

For example, in scene 801 shown in FIG. 8, the left part of the scene is illuminated by a rather cold white spectral distribution, whereas the right part of the scene will contain rather higher reddish spectral components due to the additional illumination with candle 809 to avoid color mixing.

Figure 10:
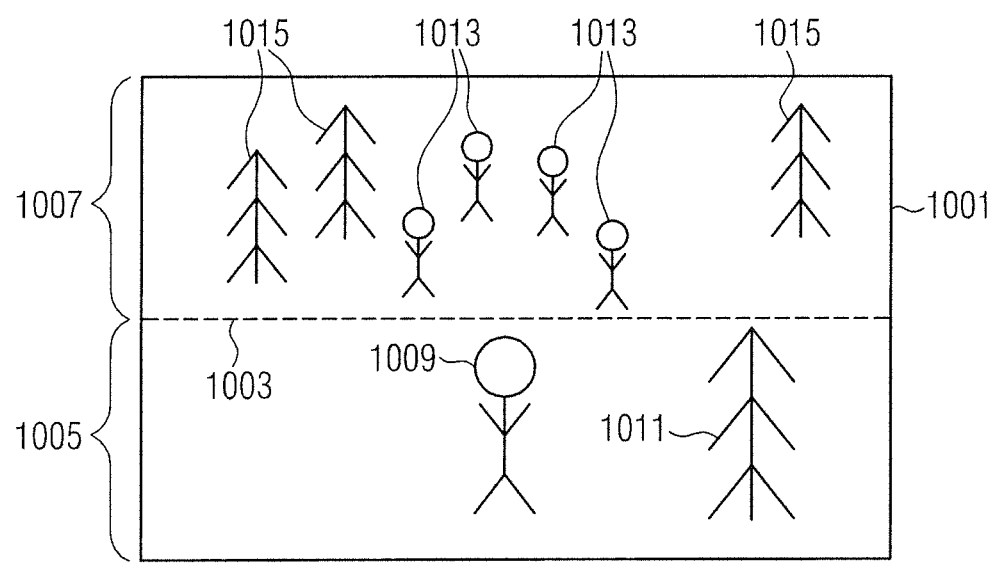
FIG. 10 shows another scene.

FIG. 10 shows another scene 1001.

Scene 1001 is divided into a foreground 1005 and a background 1007 by a symbolic dashed dividing line 1003.

In the foreground 1005 there is a person 1009 and to the right of person 1009 there is a tree 1011 in the foreground 1005.

In the background 1007 there are several persons 1013 as well as several trees 1015.

Since these are in the background 1007, they are displayed in a reduced size compared to the person 1009 and the tree 1011.

This means that objects and people in a scene can be at different distances or distances from the camera. Since an optoelectronic lighting device used for illumination is usually fixed to the objects and persons, with a fixed illuminance distribution the objects and persons, i.e., here the person 1009 and the tree 1011, would be illuminated significantly more strongly in the foreground 1005 than the persons 1003 standing and the trees 1015 located in the background 1007.

By providing a pixelated emitter, it is advantageously possible to reduce the intensity of the corresponding pixels used to illuminate the objects in the foreground, in this case the tree 1011 and the person 1009, to a value greater than zero (by dimming the pixel) or to zero (by switching off the pixel completely).

Figure 11:
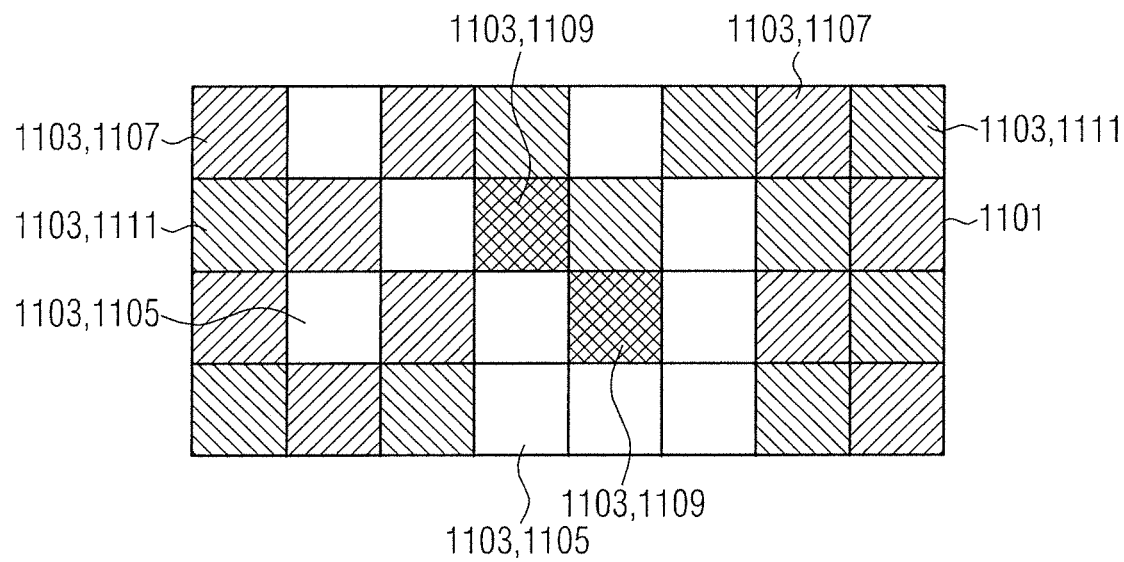
FIG. 11 shows a pixelated emitter to illuminate the scene of FIG. 10.

FIG. 11 shows an example of a configuration of a pixelated emitter 1101 comprising several light emitting pixels 1103.

The reference symbol 1105 points to pixels 1103 that are switched off, the reference symbols 1107, 1109, 1111 point to light emitting pixels 1103 that are switched on, i.e., emit light. Hereby, the light emitting pixels 1107 emit light with a higher intensity than the light emitting pixels 1109. The light emitting pixels 1109 in turn emit light with a lower intensity than the light emitting pixels 1111. The light emitting pixels 1111 in turn emit light with a lower intensity than the light emitting pixels 1107.

In particular, this results in less illumination for person 1009 in the foreground 1005 than for tree 1011 in the foreground 1005 or trees 1015 in the background 1007.

By providing a pixelated emitter comprising several light emitting pixels that can emit light of different wavelengths, efficient white balance can be achieved in particular. This is explained below.

A white balance as such is already known. Certain color locations in the CAM02 color space are used for white balance according to known algorithms. All pixels in the scene to be captured are displayed corrected according to this procedure. Color locations other than those used for white balance, however, show a larger color distance after applying the algorithm compared to the originally perceived color. Thus, for example, individual objects with which viewers associate a certain color can deviate significantly from the expected color.

For example, a face color may become too bluish when illuminated after a white balance. By spectral matching by specifying a predetermined spectral intensity distribution using a pixelated emitter, color rendering can be improved in an advantageous manner. In a scene with several objects, for example, it is intended that a color mixture is also configured locally differently such that all objects can be captured with good color rendering.

Figure 12:
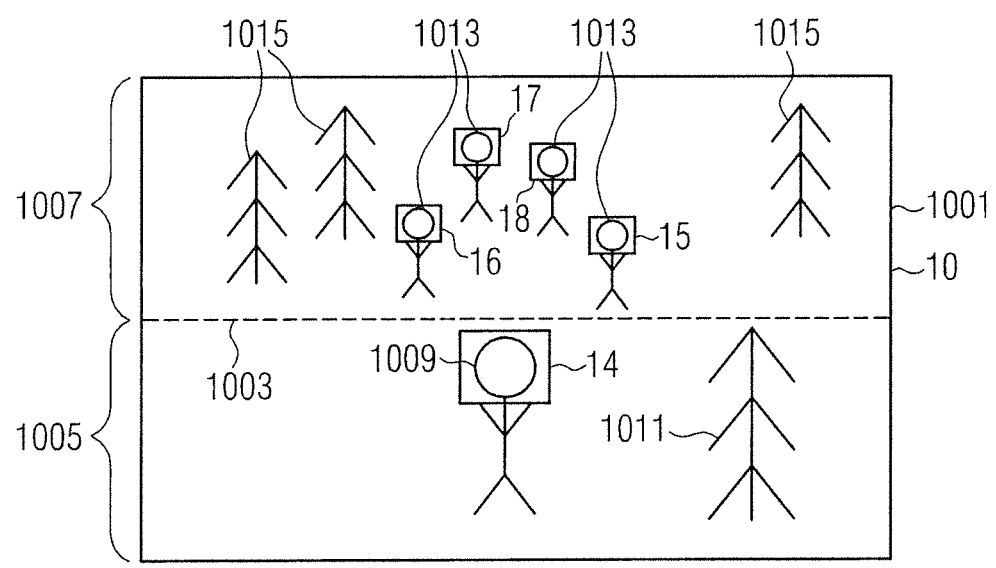
FIG. 12 shows a scene.

This is explained in more detail, for example, in connection with FIG. 12. FIG. 12 shows a scene in which several people 1009, 1013 are at different distances from the lighting device. The faces of persons 1009, 1013 are arranged in different sections 13, 14, 15, 16, 17, 18 in the field of view 10 of the lighting device. These areas can therefore be illuminated with particularly warm white light, for example, to achieve a particularly natural representation of the people in the picture.

Figure 13:
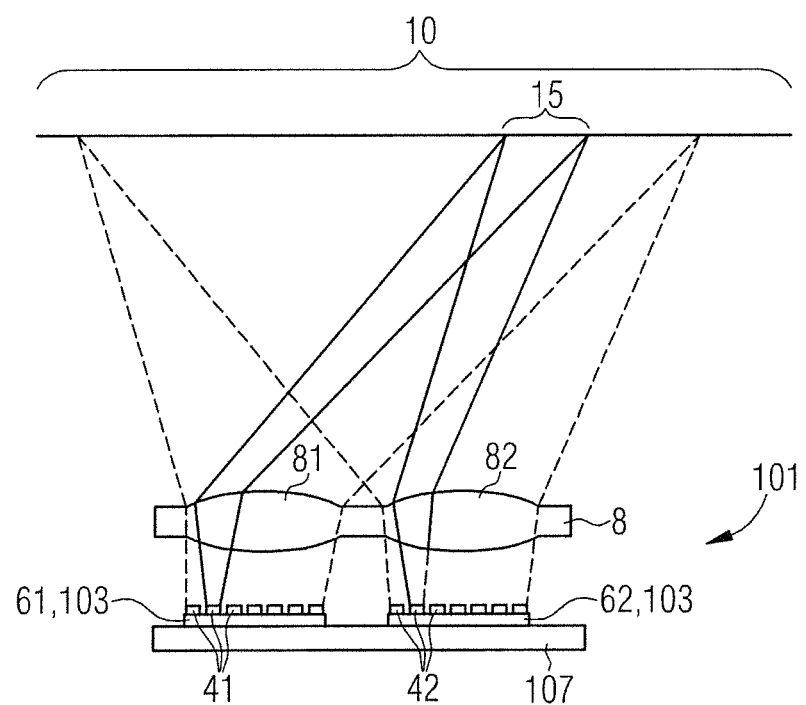
FIG. 13 shows an optoelectronic lighting device.

FIG. 13 shows an example of a light source that can be used in an example of our lighting device. In contrast to the example in FIG. 1, the light source here comprises at least two pixelated emitters 103, each formed by a semiconductor chip 61, 62. Each semiconductor chip 61, 62 contains a plurality of pixels. The radiation emitted during operation of the light source is directed by an optical element 8 into a field of view 10 of the lighting device.

The lighting device 101 has a plurality of pixels 41 of the first kind. The first type of pixels 41 are arranged in a first matrix arrangement, i.e., at the nodes of a rectangular grid, of the first semiconductor chip 61. Furthermore, the lighting device 101 has a plurality of second type pixels 42, the second type pixels 42 being arranged in a second matrix array of the second semiconductor chip 62. The first type of pixels 41 and the second type of pixels 42 differ with regard to their radiation, especially their spectral radiation. For example, the first type of pixels 41 emit warm white light for the human eye and the second type of pixels 42 emit cold white light for the human eye.

The first semiconductor chip 61 and the second semiconductor chip 62 are arranged next to each other in a lateral direction. The lateral directions are those directions that run parallel to a main extension plane of the semiconductor chips 61, 62. The semiconductor chips 61, 62 are arranged next to each other without overlapping in plan view of the lighting device 101.

The optical element 8 has a plurality of segments 81, each semiconductor chip 61, 62 being uniquely assigned a segment, for example. The segments 81 of the optical element 8 are designed such that each pixel 41 of the first semiconductor chip 61 is assigned a pixel 42 of the second semiconductor chip such that the radiation emitted by these pixels in the field of view 10 overlaps in a section 15, in particular congruently or substantially congruently.

This is shown in FIG. 13 by the dotted lines that schematically extend from one pixel 41 of the first semiconductor chip 61 and one pixel 42 of the second semiconductor chip 62 through the corresponding segment 81 of the optical element 8 and define the section 15 in the field of view 10. However, these beam paths only serve to explain the functional principle and do not represent precise beam paths in the sense of geometric optics.

In FIG. 13, segments 81 have a convex shape both on a side facing the semiconductor chips 61, 62 and on a side facing away from the semiconductor chips 61, 62. However, the optical element 8 can also be different, for example, in the form of a Fresnel optics for each segment.

Optical elements with which an overlay of assigned pixels can occur in a section of a field of view are described in DE 10 2016 124 871.1 and DE 10 2016 124 866.5, the subject matter of which is incorporated hereinby reference.

By varying the current ratio between the first type of pixel 41 and the second type of associated pixel 42, the color location can be adjusted in the section 15 of the field of view 10 illuminated by these pixels during operation of the lighting device 101. The variation of the current conditions is carried out by the driving device 107, which can also form a carrier for the semiconductor chips 61, 62. Thereby the lighting device 101 may include a single driver 107 associated with all pixelated emitters as shown, or the lighting device 101 includes a driver 107 for each pixelated emitter.

The number of pixels 41, 42 can be varied within a wide range. For example, the lighting device 101 has 10 to 1000 pixels of the first type 41. The number of first type pixels 41 is preferably equal to the number of second type pixels 42.

Figure 14A:
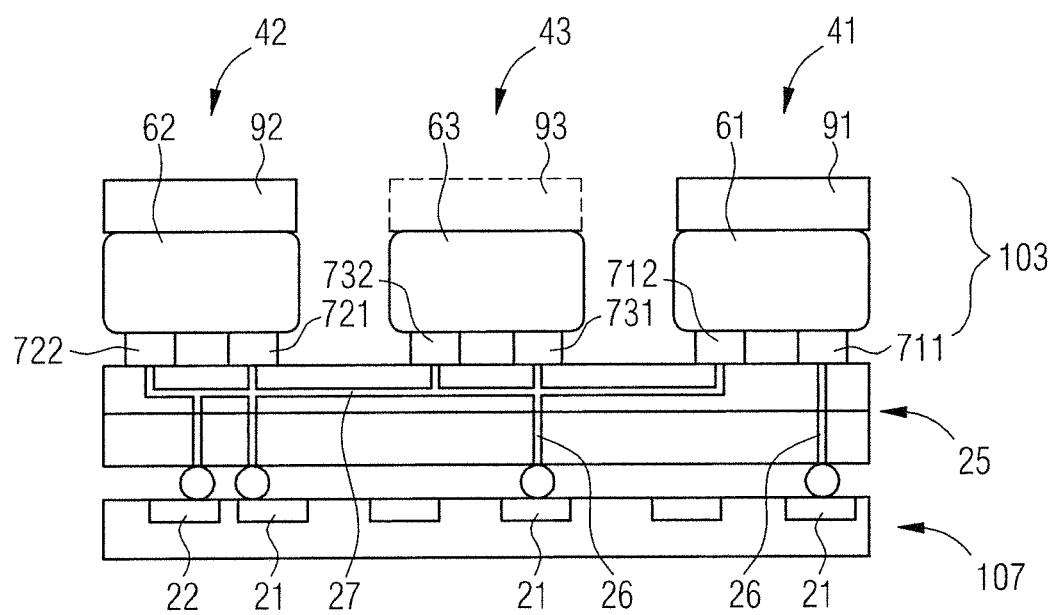
FIGS. 14A, 14B and 14C show further optoelectronic lighting devices.

FIG. 14A shows a schematic sectional view of a lighting device 101 with driving device 107 for an example of an arrangement.

In this example, the lighting device 101 comprises pixels 41, 42 and 43, each of which comprises a separate semiconductor chip 61, 62, 63 arranged laterally side by side.

The pixels 41, 42, 43 can each have semiconductor chips 61, 62, 63 of the same kind such that the pixels 41, 42, 43 differ from each other only by the converter 91, 92 applied or not applied to the semiconductor chips.

For example, the semiconductor chips 61, 62, 63 emit radiation in the blue spectral range. The first converter 91 partially converts this radiation into radiation in the yellow, green and/or red spectral range such that the first type 41 pixels emit mixed light that appears warm white or correspondingly colored light.

In contrast, the second converter 92 is designed such that the total radiation emitted by the second type of pixels 42 appears cold white or in a different color than the light of the first type of pixels 41.

The third type of pixels 43 can emit blue light, unconverted light.

For example, the thickness of converters 91, 92 is 40 µm to 100 µm, in particular 60 µm to 80 µm. This results in smoother transitions in the field of view 10 between sections 14, 15, 16 to be illuminated than with a thinner radiation conversion element. The converters not only determine the color location of the radiation emitted, but also influence the spatial radiation characteristics. If a similar effect is desired for the light of the third type of pixel 43, a non-converting diffuser 93 can follow these.

However, pixels 41, 42, 43 can also be free of converters and diffusers and formed with different semiconductor materials. For example, semiconductor chips based on arsenide compound semiconductor material are suitable for generating radiation in the red spectral range. Whereas semiconductor chips based on nitride compound semiconductor material are suitable for the generation of radiation in the blue or green spectral range.

By designing the pixels, which differ in terms of their radiation emission, as separate semiconductor chips, the appropriate semiconductor material can be selected for the respective radiation generation. Such an arrangement can therefore be characterized by a particularly high efficiency of radiation generation.

Furthermore, it is possible that the individual semiconductor chips 61, 62, 63 each form more than one pixel 41, 42, 43. For example, the first semiconductor chip 61 in the example shown in FIG. 14A forms a column of pixels of the first type 41 alone.

The total number of semiconductor chips to be placed can thus be reduced.

For an electrically conductive connection between the first semiconductor chips 61, the second semiconductor chips 62 and the third semiconductor chips 63, the semiconductor chips can be arranged side by side on an intermediate carrier 25 in the lateral direction. The intermediate carrier 25 simplifies the electrical connection between the semiconductor chips and the driving device 107.

For example, a first contact 711 of the first semiconductor chip 61, a first contact 721 of the second semiconductor chip 62 and a first contact 731 of the third semiconductor chip 63 each electrically conductively connect to terminal 21 of the driving device 107. A mating contact 712 of the first semiconductor chip, a mating contact 722 of the second semiconductor chip and a mating contact 732 of the third semiconductor chip electrically conductively connect to a common mating terminal 22 of the driving device 107. The electrical contact within the intermediate carrier 25, for example, is made via leads 27 on or in the intermediate carrier. These leads 27 extend vertically through vias 26 to driving device 107 such that driving device 107 may be located directly below semiconductor chips 61, 62, 63 for radiation generation and form a mechanically supporting carrier for intermediate carrier 25 and pixels 41, 42, 43.

In contrast, however, the driving device 107 can also be arranged spatially separate from the lighting device 101 and connected to it in an electrically conductive manner.

Figure 14B:
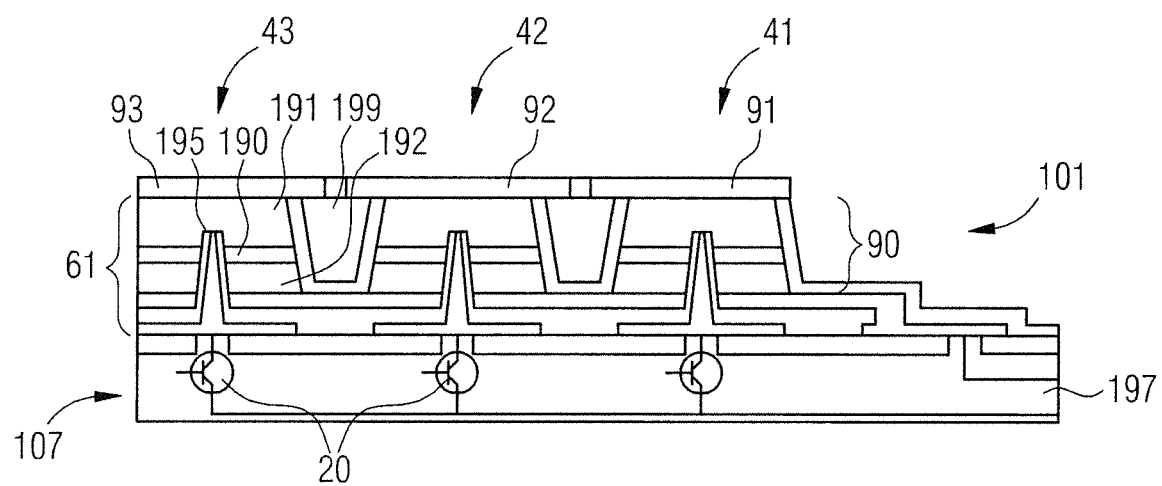

FIG. 14B shows an example of a lighting device in which several pixels 41, 42, 43 are integrated in a common semiconductor chip 61. For example, several pixels of one type are integrated in a common semiconductor chip. Furthermore, pixels of different types, for example, first type pixels and second type and third type pixels, can be integrated in a common semiconductor chip.

The semiconductor chip has a semiconductor layer sequence 90, in particular epitaxially deposited, with an active zone 190 that generates radiation, the active zone 190 being arranged between a first semiconductor layer 191 of a first conductive type, for example, n-conducting, in a second semiconductor layer 192 of a second conductive type other than the first conductive type, for example, p-conducting.

The individual pixels 41, 42, 43, in particular the active zones of these pixels, each emerge from a section of the semiconductor layer sequence 90.

In particular, these sections emerge from the same semiconductor layer sequence 90 in the production of the semiconductor chip 61 such that the semiconductor layers of the individual pixels do not differ with regard to their material and layer thickness apart from production-related lateral fluctuations.

The individual pixels are separated by spaces 199. The spaces 199 cut in particular through the active zones of 190 adjacent pixels.

The semiconductor layer sequence 90 is arranged on a carrier 197. The substrate also serves to mechanically stabilize the semiconductor layer sequence 90 such that a growth substrate for the semiconductor layer sequence is no longer required and may therefore be removed. This means that the semiconductor chip 61 can be free of a growth substrate.

A driving device 107 with a plurality of switches 20 is arranged in the carrier 197. A switch 20 is assigned to each pixel such that the individual pixels can be operated independently of each other during operation of the lighting equipment.

The first semiconductor layer 191 arranged on the side of the active zone 190 remote from the carrier 197 electrically conductively connects to an associated switch 20 by recesses 195. The second semiconductor layers 192 of the pixels electrically conductively connect to each other and can be at the same electrical potential when the lighting device 101 is in operation. Both sides of the active zones 190 are therefore accessible for electrical contact from the side facing the carrier 197. The electrical contacting of the individual pixels can be varied within wide limits as long as the individual pixels can be individually controlled and charge carriers can reach the active zone 190 from opposite sides during operation of the semiconductor chip and recombine there while emitting radiation.

On the side of the semiconductor layer sequence 90 remote from the carrier 197, a first converter 91, a second converter 92 and optionally a diffuser 93 are assigned to the first type of pixels 41, the second type of pixels 42 and the third type of pixels 43, respectively. Converters 92, 92 and diffuser 93 can be designed as described in FIG. 13.

The example described in FIG. 14C essentially corresponds to the example described in connection with FIG. 14B. In contrast, a common converter 91 extends over the semiconductor chip 61, which forms a plurality of similar pixels, for example, a plurality of first type pixels 41. Such a common converter 91 for formation of similar pixels 41 can also be used for the example described in FIG. 14B.

Figure 14C:
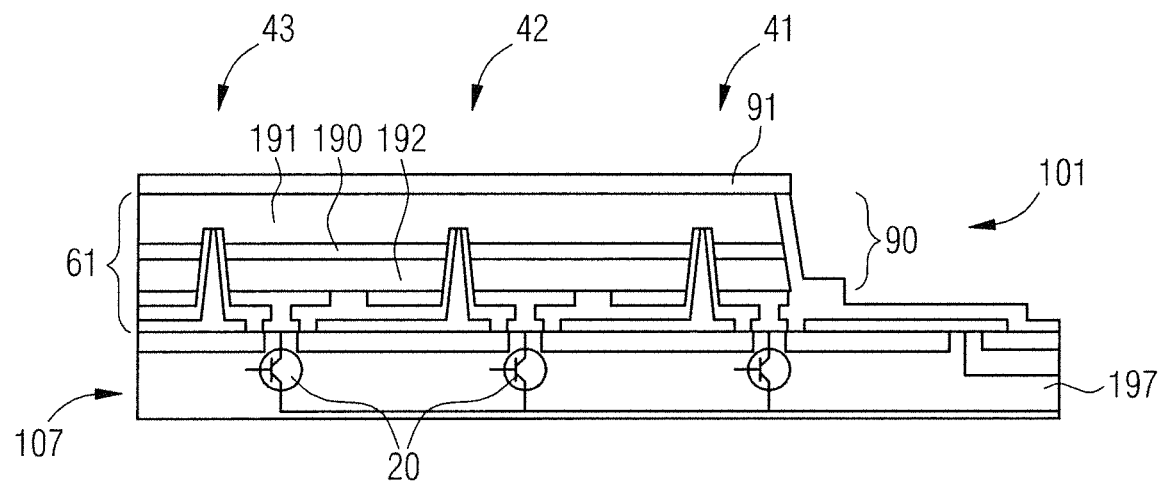

Furthermore, the semiconductor layer sequence 90 in the example shown in FIG. 14C is not separated between adjacent pixels 41 of the first type. The spatial separation between adjacent pixels is mainly due to the lateral current expansion during the electrical contacting of the individual pixels. In the example shown, the spatial extent of the electrical connection to the second semiconductor layer 192 determines the lateral extent of the radiation emission of a first type pixel 41.

This results in smooth transitions between the individual pixels 41. Using such a light source to illuminate the scene reduces the risk of too sharp transitions between such sections 14, 15, 16 of the field of view 10, which could make images taken under such lighting appear unnatural.

Further designs for semiconductor chips with individually controllable pixels are described in U.S. Pat. Nos. 9,362,335 and 9,192,021 in a different context. The entire disclosure content of these publications is incorporated herein by reference.

We surprisingly found that the basic design and electrical contacting of individual pixels in a common semiconductor chip is suitable for a lighting device for use in a flashlight.

In summary, we provide an efficient technical concept based on which illumination or lighting of a scene can be efficiently improved depending on different framework conditions, contents or configurations of the scene. The scene is usually recorded with a camera. Furthermore, overexposure and underexposure of individual objects/persons can be avoided. In particular, a color temperature can be adjusted for a natural-looking color rendering. In particular, a mixture of lights (light sources) with different color temperatures can be avoided or reduced. In particular, this can improve the input data for an application of a known standardized algorithm for the white balance of a scene.

By using pixelated emitters that can be operated individually or in all freely selectable combinations and can therefore be used for lighting, the illuminance distribution and local color location of the illumination can be configured depending on the general conditions, the contents or configurations of the scene. Thus, the reproduction of the scene and thus the quality of the recorded scene can be significantly improved after computational processing with the aid of various common image processing algorithms.

By changing the number of light emitting pixels of the emitter contributing to the illumination, especially with an appropriate object lens, the intensity distribution of the illumination or an alignment to the size of the scene to be detected (camera format, wide angle, bundling of the zoom function) is advantageously achieved.

By changing the number of light emitting pixels of the emitter contributing to the illumination, a special illumination of certain areas in the scene to be detected, for example, objects/persons in the foreground with a lower intensity than objects/persons at a greater distance; or scene in a room where additional illumination through a window is present on one side, whereas the other side of the room is dark such that the other side of the room is illuminated more strongly than the window. Special illumination is achieved in particular by local variation of illuminance by switching the relevant pixel groups on and off.

Different color temperatures and spectra can be achieved by applying different converter materials to the individual, separately operable or controllable pixels of the emitter. Depending on the environment, these can be used to reduce and/or avoid color temperature mixtures in the scene and thus enable uniform and homogeneous color rendering on the scene to be detected.

Furthermore, it is possible to avoid glare for people standing in a certain area of the scene close to the camera by dimming the corresponding pixels used to illuminate this area.

Although our devices, methods, cameras and terminals are illustrated and described in detail by preferred examples, this disclosure is not limited by the examples and other variants can be derived by those skilled in the art without leaving the scope of protection of the appended claims.

Priority of DE 102016104381.8 is claimed, the entire subject matter of which is incorporated herein by reference.

The invention claimed is:

1. An optoelectronic lighting device that illuminates a scene to be captured as an image comprising:

two or more pixelated emitters each comprising a plurality of light emitting pixels that illuminate a scene to be captured as an image, a driving device configured to individually drive the pixels depending on at least one parameter to illuminate the scene to be recorded with a predetermined illuminance distribution, and an optical element, wherein each pixelated emitter comprises at least one semiconductor chip comprising two or more of the plurality of pixels, the semiconductor chip has an epitaxially deposited semiconductor layer sequence, the semiconductor layer sequence is part of two or more of the plurality of pixels, and the optical element is configured such that each pixel of one of the two or more pixelated emitters is assigned to a pixel of another of the two or more pixelated emitters such that the radiation emitted by the pixels congruently overlaps in a common section of the scene to be captured.

2. The optoelectronic lighting device according to claim 1, wherein at least some of the pixels are configured to emit light of different wavelengths, the driving device configured to individually drive the pixels depending on the at least one parameter such that the scene to be recorded is illuminated with a predetermined spectral intensity distribution.

3. The optoelectronic lighting device according to claim 1, wherein the driving device is configured to individually control the pixels depending on the at least one parameter such that predetermined locations in the scene to be recorded are each illuminated with light having a predetermined color temperature.

4. The optoelectronic lighting device according to claim 1, wherein the driving device is configured to control a respective operating current for the pixels depending the at least one parameter.

5. The optoelectronic lighting device according to claim 1, wherein the at least one parameter is an element selected from parameters 1)-6):
  1) a recording format of the image,
  2) a location of a luminous light source in the scene,
  3) a color temperature of a luminous light source in the scene,
  4) a light intensity of a luminous light source in the scene,
  5) a distance of an object in the scene from the pixelated emitter,
  6) a material property of an object in the scene.

6. The optoelectronic lighting device according to claim 1, wherein the driving device is configured, depending on the recording format of the image, to drive the light emitting pixels such that light emitting pixels that illuminate an area of the scene outside a recording area corresponding to the recording format are dimmed compared to light emitting pixels that illuminate the recording area or switched off.

7. The optoelectronic lighting device according to claim 1, wherein the driving device is configured depending on a first distance of a first object and a second distance of a second object in the scene to the pixelated emitter, and the first distance is smaller than the second distance, to drive the light emitting pixels such that light emitting pixels illuminating the first object compared to light emitting pixels illuminating the second object are dimmed or switched off.

8. The optoelectronic lighting device according to claim 1, wherein the driving device is configured, depending on a reflectivity of an illuminated surface of at least one object, to drive the light emitting pixels such that light emitting pixels that illuminate a surface of higher reflectivity compared to light emitting pixels that illuminate a surface of lower reflectivity are dimmed or switched off.

9. The optoelectronic lighting device according to claim 1, wherein the driving device is configured, depending on a color of the surface of at least one object, to drive the light emitting pixels such that light emitting pixels illuminating a surface of a first color are dimmed or switched off compared to light emitting pixels illuminating a surface of another color.

10. The optoelectronic lighting device according to claim 1, wherein the driving device is configured to drive the light emitting pixels such that a face of a person is illuminated with a different illuminance and/or with light of a different color location than the surroundings.

11. The optoelectronic lighting device according to claim 1, wherein each of the pixelated emitters is formed by exactly one semiconductor chip.

12. The optoelectronic lighting device according to claim 1, wherein light of the at least two pixelated emitters is emitted through the optical element into a field of view of the lighting device, and the field of view is divided into a plurality of sections.

13. A method of illuminating a scene to be captured as an image with the optoelectronic lighting device according to claim 1 comprising:
  providing at least one parameter, and
  illuminating the scene to be recorded with a predetermined illuminance distribution by driving the light emitting pixels by the driving device based on the at least one parameter.

14. A camera that captures an image of a scene comprising:
  an image sensor that captures an image of a scene,
  an object lens that images the scene onto the image sensor, and
  the optoelectronic lighting device according to claim 1.

15. The camera according to claim 14 further comprising a processor configured to determine the at least one parameter from a captured image of the scene.

16. A mobile terminal comprising the camera according to claim 14.

17. A mobile terminal comprising the optoelectronic lighting device according to claim 1.

18. A mobile telephone comprising the mobile terminal according to claim 16.

19. A mobile telephone comprising the mobile terminal according to claim 17.

20. An optoelectronic lighting device that illuminates a scene to be captured as an image comprising:
  two or more pixelated emitters each comprising a plurality of light emitting pixels that illuminate a scene to be captured as an image, and
  a driving device configured to individually drive the pixels depending on at least one parameter to illuminate the scene to be recorded with a predetermined illuminance distribution,
  wherein the each pixelated emitter comprises at least one semiconductor chip comprising two or more of the plurality of pixels,
  the semiconductor chip has an epitaxially deposited semiconductor layer sequence,
  the semiconductor layer sequence is part of two or more of the plurality of pixels,
  pixels of one of the pixelated emitters are configured to emit warm white light in operation and pixels of another of the pixelated emitters are configured to emit cold white light in operation, and
  radiation emitted by at least one pixel of one of the two or more pixelated emitters and by at least one pixel of another of the two or more pixelated emitters congruently overlaps in a common section of the scene to be captured.

21. The optoelectronic lighting device according to claim 20, wherein an additional pixelated emitter of the two or more pixelated emitters is configured to emit colored light in operation.

22. An optoelectronic lighting device that illuminates a scene to be captured as an image comprising:
  two or more pixelated emitters each comprising a plurality of light emitting pixels that illuminate a scene to be captured as an image, and
  a driving device configured to individually drive the pixels depending on at least one parameter to illuminate the scene to be recorded with a predetermined illuminance distribution, and
  an optical element,
  wherein the each pixelated emitter comprises at least one semiconductor chip comprising two or more of the plurality of pixels,
  the semiconductor chip has an epitaxially deposited semiconductor layer sequence, and
  the semiconductor layer sequence is part of two or more of the plurality of pixels,
  pixels of one of the two or more pixelated emitters are configured to emit warm white light in operation and pixels of another of the two or more pixelated emitters are configured to emit cold white light in operation,
  the light of the at least two pixelated emitters is emitted through the optical element into a field of view of the lighting device, and the field of view is divided into a plurality of sections, and each section is illuminated by at least one pixel of one of the two or more pixelated emitters and by at least one pixel of another of the two or more pixelated emitters such that radiation emitted by the pixels overlaps in a common section of the scene to be captured, and
radiation emitted by the pixels in the field of view overlaps in the common section congruently.

\* \* \* \* \*